(12) United States Patent
Dai et al.

(10) Patent No.: US 12,236,845 B2
(45) Date of Patent: Feb. 25, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Junxiu Dai, Beijing (CN); Yang Zhou, Beijing (CN); Lu Bai, Beijing (CN); Xin Zhang, Beijing (CN); Yi Qu, Beijing (CN); Siyu Wang, Beijing (CN); Song Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/907,936

(22) PCT Filed: Sep. 29, 2021

(86) PCT No.: PCT/CN2021/121742
§ 371 (c)(1),
(2) Date: Aug. 29, 2022

(87) PCT Pub. No.: WO2023/050164
PCT Pub. Date: Apr. 6, 2023

(65) Prior Publication Data
US 2024/0194123 A1 Jun. 13, 2024

(51) Int. Cl.
*G09G 3/32* (2016.01)
*H01L 25/075* (2006.01)
(Continued)

(52) U.S. Cl.
CPC .......... *G09G 3/32* (2013.01); *H01L 25/0753* (2013.01); *H01L 25/167* (2013.01);
(Continued)

(58) Field of Classification Search
CPC ............. G09G 3/32; G09G 2310/0267; G09G 2320/0233; H01L 25/167; H01L 25/0753; H01L 27/124; H01L 33/62
(Continued)

(56) References Cited

U.S. PATENT DOCUMENTS 10,181,506 B2  1/2019 Sato
2012/0274612 A1  11/2012 Sogabe et al.
(Continued)

FOREIGN PATENT DOCUMENTS

CN  101118359 A  2/2008
CN  102760718 A  10/2012
(Continued)

*Primary Examiner* — Jimmy H Nguyen
(74) *Attorney, Agent, or Firm* — BROOKS KUSHMAN P.C.

(57) ABSTRACT

A display substrate includes a first voltage line, an alternating current signal line and a second voltage line arranged on a substrate, the substrate includes a display region and a non-display region; the display substrate further includes a first conductive layer, a first insulation layer and a second conductive layer laminated one on another on the substrate, the first voltage line and the alternating current signal line are arranged on the first conductive layer, and the second voltage line is arranged on the second conductive layer; the first voltage line is lapped onto the second voltage line through a first groove penetrating through the first insulation layer; and an orthogonal projection of the second voltage line onto the substrate overlaps an orthogonal projection of the alternating current signal line onto the substrate at an overlapping region.

19 Claims, 16 Drawing Sheets

(51) Int. Cl.
    *H01L 25/16*     (2023.01)
    *H01L 27/12*     (2006.01)
    *H01L 33/62*     (2010.01)

(52) U.S. Cl.
    CPC ............ H01L 27/124 (2013.01); H01L 33/62 (2013.01); *G09G 2310/0267* (2013.01); *G09G 2320/0233* (2013.01)

(58) Field of Classification Search
    USPC .......................................................... 345/55
    See application file for complete search history.

(56) References Cited

U.S. PATENT DOCUMENTS

| | | |
|---|---|---|
| 2013/0270582 A1 | 10/2013 | Shin et al. |
| 2016/0343980 A1 | 11/2016 | Lee et al. |
| 2019/0305072 A1* | 10/2019 | Park .................... G09G 3/3233 |

FOREIGN PATENT DOCUMENTS

| | | |
|---|---|---|
| CN | 103376606 A | 10/2013 |
| CN | 109524445 A | 3/2019 |
| CN | 110989857 A | 4/2020 |
| CN | 111081714 A | 4/2020 |
| CN | 112581871 A | 3/2021 |

\* cited by examiner

DISPLAY SUBSTRATE AND DISPLAY DEVICE

CROSS-REFERENCE TO RELATED APPLICATION

This application is the U.S. national phase of PCT Application No. PCT/CN2021/121742 filed on Sep. 29, 2021, which is incorporated herein by reference in its entirety.

TECHNICAL FIELD

The present disclosure relates to the field of display technology, in particular to a display substrate and a display device.

BACKGROUND

Currently, a mainstream flexible panel intends to provide a narrow bezel, increase a refresh rate and a resolution, and reduce the power consumption, so the layout of metal lines is strictly required. Signals in a first row and a last row of the panel are attenuated to different extents due to impedance and capacitance, and thereby a display effect is adversely affected significantly. How to reduce the impedance and capacitance between adjacent lines in a limited space is the key to an increase in the performance of the panel.

SUMMARY

In one aspect, the present disclosure provides in some embodiments a display substrate, including a first voltage line, an alternating current signal line and a second voltage line arranged on a substrate. The substrate includes a display region and a non-display region surrounding the display region, and the first voltage line, the alternating current signal line and the second voltage line are arranged at the non-display region. The display substrate further includes a first conductive layer, a first insulation layer and a second conductive layer laminated one on another on the substrate, the first voltage line and the alternating current signal line are arranged on the first conductive layer, and the second voltage line is arranged on the second conductive layer. The first voltage line is lapped onto the second voltage line through a first groove penetrating through the first insulation layer, an orthogonal projection of the second voltage line onto the substrate overlaps an orthogonal projection of the alternating current signal line onto the substrate at an overlapping region, and a ratio of an area of the overlapping region to an area of the orthogonal projection of the alternating current signal line onto the substrate is within a first predetermined ratio range.

In a possible embodiment of the present disclosure, the first predetermined ratio range is greater than or equal to 0.2 and smaller than or equal to 0.9.

In a possible embodiment of the present disclosure, a plurality of protrusions and a plurality of recesses are arranged alternately at an edge of the second voltage line close to the display region, and each protrusion protrudes towards the display region.

In a possible embodiment of the present disclosure, an orthogonal projection of an edge of the second voltage line close to the display region onto the substrate is located within the orthogonal projection of the alternating current signal line onto the substrate.

In a possible embodiment of the present disclosure, each of the protrusions and the recesses is of a rectangular shape.

In a possible embodiment of the present disclosure, each of the protrusions and the recesses is of a trapezoidal shape.

In a possible embodiment of the present disclosure, each of the protrusions and the recesses is of an arc-like shape.

In a possible embodiment of the present disclosure, a ratio of a maximum length W1 of the recess in a first direction to a maximum length W2 of the protrusion in the first direction is within a second predetermined ratio range, and the first direction is the same as an extension direction of the alternating current signal line.

In a possible embodiment of the present disclosure, the second predetermined ratio range is greater than or equal to 0.5 and smaller than or equal to 2.

In a possible embodiment of the present disclosure, the display substrate further includes a pixel circuit arranged at the display region and a scanning driving circuit arranged at the non-display region, the first voltage line and the second voltage line are low voltage lines configured to provide a low voltage signal to a cathode of a light-emitting element in the pixel circuit, and the alternating current signal line is an initial voltage signal configured to provide an initial voltage signal to the scanning driving circuit.

In a possible embodiment of the present disclosure, the display substrate further includes a first clock signal line arranged on the substrate, the first clock signal line is arranged at the second conductive layer and at a side of the second voltage line close to the display region, and a minimum distance between the second voltage line and the first clock signal line is within a first predetermined distance range.

In a possible embodiment of the present disclosure, the first predetermined distance range is greater than or equal to 3 µm.

In a possible embodiment of the present disclosure, a first scanning driving circuit region is arranged between the first voltage line and the alternating current signal line, and a portion of the second voltage line corresponding to the first scanning driving circuit region is provided with a plurality of first openings.

In a possible embodiment of the present disclosure, a minimum distance between each first opening and the edge of the second voltage line close to the display region is within a second predetermined distance range.

In a possible embodiment of the present disclosure, the second predetermined distance range is greater than or equal to 2.5 µm.

In a possible embodiment of the present disclosure, a plurality of protrusions and a plurality of recesses are arranged at an edge of the second voltage line close to the display region, and a shape of the first opening corresponds to a shape of the protrusion and a shape of the recess.

In a possible embodiment of the present disclosure, the display substrate further includes a first conductive connection member and a light-emitting element arranged on the substrate, and a third conductive layer arranged at a side of the second conductive layer away from the substrate. The first conductive connection member and an anode of the light-emitting element are arranged on the third conductive layer, the first conductive connection member is separated from the anode of the light-emitting element, and the first conductive connection member is lapped onto the second voltage line.

In a possible embodiment of the present disclosure, the display substrate further includes a second insulation layer arranged between the third conductive layer and the second conductive layer, the second insulation layer is provided with a second groove and a plurality of second openings, the first conductive connection member is lapped onto the second voltage line through the second groove and the second opening, and an orthogonal projection of the second groove onto the substrate at least partially overlaps an orthogonal projection of the first groove onto the substrate.

In a possible embodiment of the present disclosure, the first conductive connection member is provided with a plurality of third openings.

In a possible embodiment of the present disclosure, the display substrate further includes a pixel definition layer arranged at a side of the third conductive layer away from the substrate, the pixel definition layer includes a plurality of protection patterns, an orthogonal projection of each protection pattern onto the substrate covers an orthogonal projection of a corresponding third opening onto the substrate to protect the third opening, and there is a gap between the adjacent protection patterns.

In a possible embodiment of the present disclosure, the display substrate further includes a second conductive connection member, and a fourth conductive layer arranged at a side of the third conductive layer away from the substrate. The second conductive connection member and a cathode of the light-emitting element are arranged on the third conductive layer, the second conductive connection member is electrically coupled to the cathode of the light-emitting layer, and the second conductive connection member is lapped onto the first conductive connection member through the gap.

In a possible embodiment of the present disclosure, the display substrate further includes a second clock signal line, a third clock signal line and a fourth clock signal line, the fourth clock signal line and the second clock signal line are arranged on the first conductive layer, the third clock signal line is arranged on the second conductive layer, the first insulation layer is further provided with a third groove and a fourth groove both penetrating through the first insulation layer, the first clock signal line is lapped onto the second clock signal through the third groove, and the third clock signal line is lapped onto the fourth clock signal line through the fourth groove.

In a possible embodiment of the present disclosure, a second scanning driving circuit region is arranged at a side of the alternating current signal line away from the first voltage line, a spacing region is arranged between the first scanning driving circuit region and the second scanning driving circuit region, a portion of the second voltage line corresponding to the spacing region is provided with a plurality of first openings, and the alternating current signal line is arranged at the spacing region.

In a possible embodiment of the present disclosure, the display substrate further includes a second clock signal line and a fourth clock signal line both arranged at the spacing region, and the second clock signal line and the fourth clock signal line are arranged on the first conductive layer.

In a possible embodiment of the present disclosure, the non-display region includes a first side region, a second side region, a third side region, a fourth side region and four rounded-corner regions, the first side region is arranged opposite to the second side region, the third side region is arranged opposite to the fourth side region, a scanning driving circuit is arranged at each of the four rounded-corner regions, the first side region and the second side region, the second voltage line is arranged at each of the first side region, the second side region and the four rounded-corner regions, and the display substrate further includes a third voltage line electrically coupled to the second voltage line and arranged at each of the third side region and the fourth side region.

In another aspect, the present disclosure provides in some embodiments a display device including the above-mentioned display substrate.

DETAILED DESCRIPTION

Figure 1:
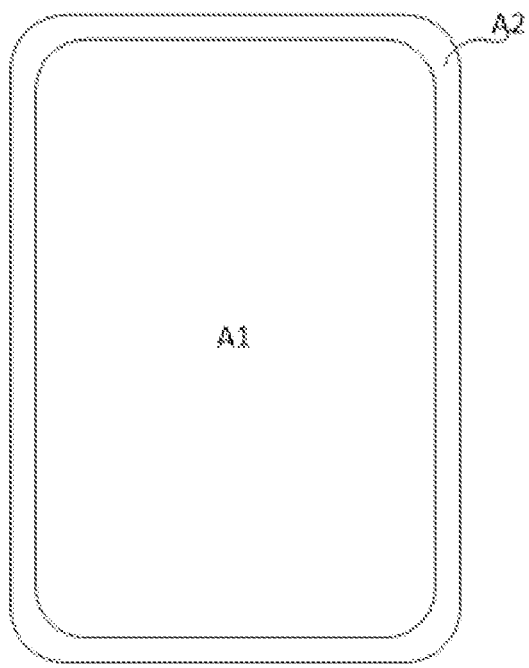
FIG. 1 is a schematic view showing regions of a display substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be triodes, thin film transistors (TFT), field effect transistors (FETs) or any other elements having an identical characteristic. In order to differentiate two electrodes other than a control electrode from each other, one of the two electrodes is called as first electrode and the other is called as second electrode.

In actual use, when the transistor is a TFT or FET, the control electrode may be a gate electrode, the first electrode may be a drain electrode and the second electrode may be a source electrode, or the control electrode may be a gate electrode, the first electrode may be a source electrode and the second electrode may be a drain electrode.

The present disclosure provides in some embodiments a display substrate, which includes a first voltage line, an alternating current signal line and a second voltage line arranged on a substrate. The substrate includes a display region and a non-display region surrounding the display region, and the first voltage line, the alternating current signal line and the second voltage line are arranged at the non-display region. The display substrate further includes a first conductive layer, a first insulation layer and a second conductive layer laminated one on another on the substrate, the first voltage line and the alternating current signal line are arranged on the first conductive layer, and the second voltage line is arranged on the second conductive layer. The first voltage line is lapped onto the second voltage line through a first groove penetrating through the first insulation layer, an orthogonal projection of the second voltage line onto the substrate overlaps an orthogonal projection of the alternating current signal line onto the substrate at an overlapping region, and a ratio of an area of the overlapping region to an area of the orthogonal projection of the alternating current signal line onto the substrate is within a first predetermined ratio range.

According to the display substrate in the embodiments of the present disclosure, the first voltage line is arranged in such a manner as to be lapped onto the second voltage line through the first groove penetrating through the first insulation layer, so as to reduce a resistance of a signal line including the first voltage line and the second voltage line. In addition, the second voltage line is arranged at a layer different from the alternating current signal line, the orthogonal projection of the second voltage line onto the substrate overlaps the orthogonal projection of the alternating current signal line onto the substrate at the overlapping region, and the area of the overlapping region is smaller than the area of orthogonal projection of the alternating current signal line onto the substrate, so as to reduce the interference caused by the second voltage line on an alternating current signal provided by the alternating current signal line and output the alternating current signal stably, thereby to improve the display uniformity.

In at least one embodiment of the present disclosure, the first conductive layer is, but not limited to, a first source-drain metal layer, and the second conductive layer is, but not limited to, a second source-drain metal layer.

In at least one embodiment of the present disclosure, the display substrate further includes a pixel circuit arranged at the display region and a scanning driving circuit arranged at the non-display region. The alternating current signal line is, but not limited to, an initial voltage line configured to provide an initial voltage signal to the scanning driving circuit. The first voltage line and the second voltage line are, but not limited to, low voltage lines configured to provide a low voltage signal to a cathode of a light-emitting element in the pixel circuit.

In at least one embodiment of the present disclosure, the first voltage line is electrically coupled to the second voltage line.

In a possible embodiment of the present disclosure, the first predetermined ratio range is, but not limited to, greater than or equal to 0.2 and smaller than or equal to 0.9. For example, the orthogonal projection of the second voltage line onto the substrate overlaps the orthogonal projection of the alternating current signal line onto the substrate at the overlapping region, and the ratio of the area of the overlapping region to the area of the orthogonal projection of the alternating current signal line onto the substrate is, but not limited to, 0.2, 0.25, 0.3, 0.35, 0.4, 0.45, 0.5, 0.55. 0.6, 0.65, 0.7, 0.75, 0.8, 0.85 or 0.9.

In at least one embodiment of the present disclosure, during the manufacture of the display substrate, the non-display region is a region between the display region and a to-be-cut region, and the to-be-cut region is to be cut off subsequently, i.e., the non-display region is a region surrounding the display region.

As shown in FIG. 1, the substrate includes a display region A1 and a non-display region A2 surrounding the display region A1.

Figure 2:
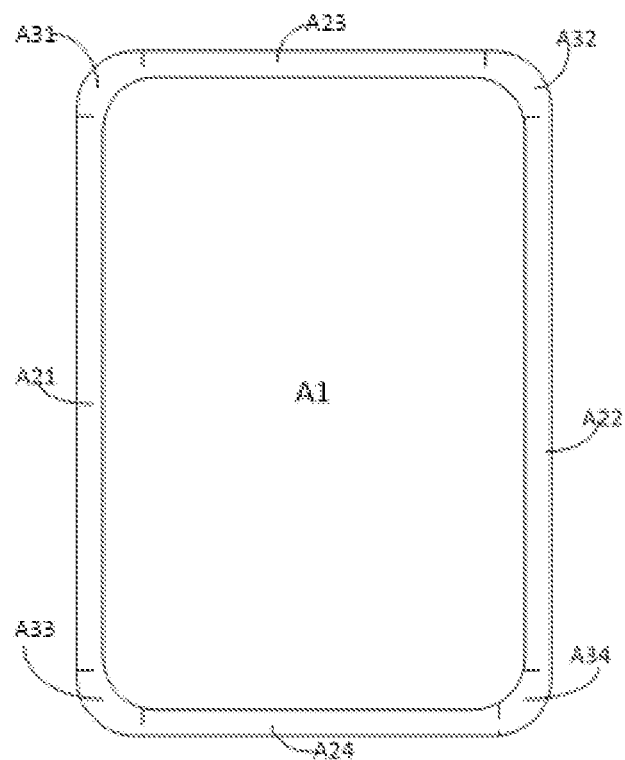
FIG. 2 is another schematic view showing the regions of the display substrate according to one embodiment of the present disclosure.

As shown in FIG. 2, the non-display region A2 includes a first side region A21, a second side region A22, a third side region A23, a fourth side region A24, a first rounded-corner region A31, a second rounded-corner region A32, a third rounded-corner region A33 and a fourth rounded-corner region A34. A scanning driving circuit is arranged at each of A21, A22, A31, A32, A33 and A34. The scanning driving circuit includes a first scanning driving circuit configured to provide a light-emission control signal and a second scanning driving circuit configured to provide a gate driving signal. A21 is arranged opposite to A22, and A23 is arranged opposite to A24.

In FIG. 2, A21 is arranged on the left side of A1, A22 is arranged on the right side of A1, and at A1, a gate line extends in a horizontal direction. A23 is arranged on the top of A1, A24 is arranged at the bottom of A1, and at A1, a data line extends in a longitudinal direction.

During the implementation, the second voltage line is arranged at A21, A22, A31, A32, A33 or A34. In at least one embodiment of the present disclosure, the description will be given when the second voltage line is arranged at A21.

In actual use, the third voltage line is arranged at each of the third side region A23 and the fourth side region A24, and electrically coupled to the second voltage line. A signal transmitted by the third voltage line is the same as that transmitted by the second voltage line, but no hole is formed in the third voltage line.

In a possible embodiment of the present disclosure, the third voltage line is, but not limited to, arranged on the second conductive layer.

In at least one embodiment of the present disclosure, the display substrate further includes a first clock signal line arranged on the substrate. The first clock signal line is arranged on the second conductive layer and at a side of the second voltage line close to the display region. A minimum distance d1 between the second voltage line and the first clock signal line is within a first predetermined distance range.

During the implementation, the first clock signal line is arranged at a side of the second voltage line close to the display region, and the minimum distance between the first clock signal line and the second voltage line is within the first predetermined distance range. In this way, it is able to achieve effective exposure and prevent the occurrence of crosstalk.

In a possible embodiment of the present disclosure, the first predetermined distance range is, but not limited to, greater than or equal to 3 μm.

During the implementation, the first voltage line and the alternating current signal line are both arranged on the first conductive layer, the second voltage line is arranged on the second conductive layer, and a first insulation layer (e.g., a first planarization layer) is arranged between the first conductive layer and the second conductive layer.

In at least one embodiment of the present disclosure, the display substrate further includes a second clock signal line, a third clock signal line and a fourth clock signal line. The fourth clock signal line and the second clock signal line are arranged on the first conductive layer, and the third clock signal line is arranged on the second conductive layer. The first insulation layer is further provided with a third groove and a fourth groove both penetrating through the first insulation layer, the first clock signal line is lapped onto the second clock signal through the third groove, and the third clock signal line is lapped onto the fourth clock signal line through the fourth groove.

Figure 3:
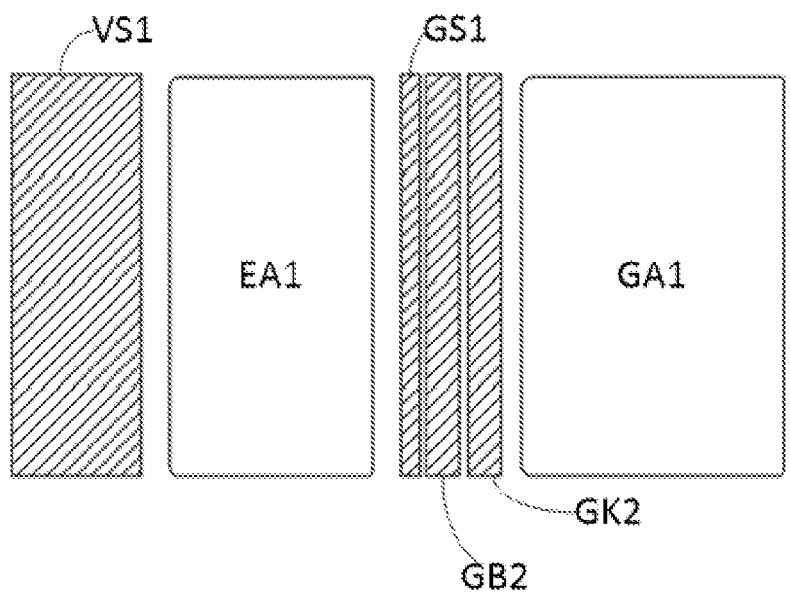
FIG. 3 is a schematic view showing the layout of a first conductive layer according to one embodiment of the present disclosure.

As shown in FIG. 3, a first conductive layer is formed on the substrate, and then patterned to form a first voltage line VS1, an alternating current signal line GS1, a second clock signal line GB2 and a fourth clock signal line GK2 which all extend longitudinally.

In FIG. 3, EA1 represents a first scanning driving circuit region, and GA1 represents a second scanning driving circuit region. At least a part of a first scanning driving circuit is arranged at EA1, and at least a part of a second scanning driving circuit is arranged at GA1.

As shown in FIG. 3, EA1 is arranged between VS1 and GS1, and GA1 is arranged at a side of GS1 close to the display region.

Figure 4:
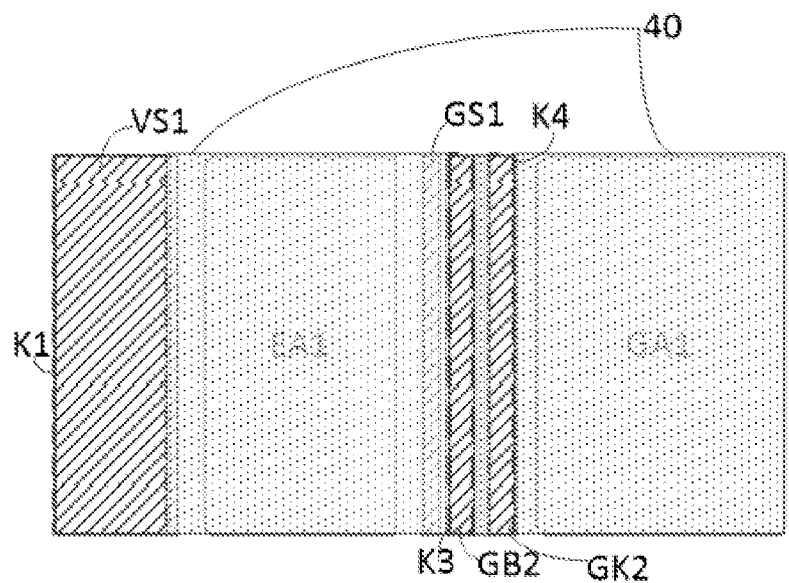
FIG. 4 is a schematic view showing the superimposition of the first conductive layer and a first insulation layer according to one embodiment of the present disclosure.

As shown in FIG. 4, a first insulation layer 40 is arranged at a side of the first conductive layer away from the substrate, and provided with three grooves, i.e., a first groove K1, a third groove K3 and a fourth groove K4.

An orthogonal projection of the first groove K1 onto the substrate is located within an orthogonal projection of the first voltage line VS1 onto the substrate, an orthogonal projection of the third groove K3 onto the substrate is located within an orthogonal projection of the second clock signal line GB2 onto the substrate, and orthogonal projection of the fourth groove K4 onto the substrate is located within an orthogonal projection of the fourth clock signal line GK2 onto the substrate.

In FIG. 4, the first insulation layer is a first planarization layer.

Figure 5:
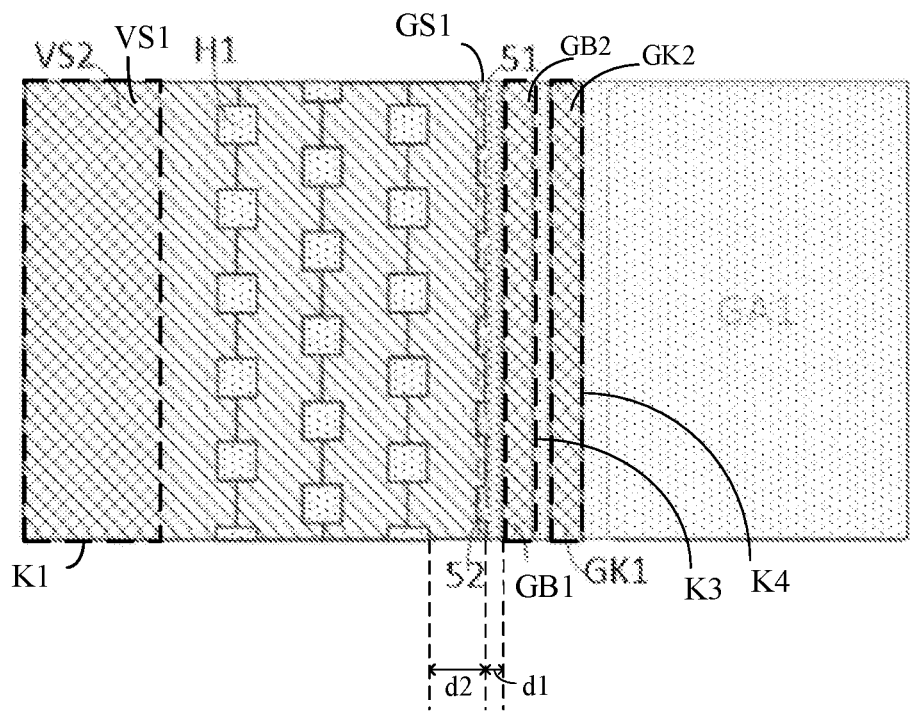
FIG. 5 is a schematic view showing the superimposition of the first conductive layer, the first insulation layer and a second conductive layer according to one embodiment of the present disclosure.

As shown in FIG. 5, a second conductive layer is arranged at a side of the first insulation layer away from the substrate, and then patterned to form the second voltage line VS2, the first clock signal line GB1 and the third clock signal line GK1. GB1 and GK1 extend longitudinally. VS2 is lapped onto VS1 through the first groove K1, so as to reduce a resistance of a signal line including VS1 and VS2. GB1 is lapped onto GB2 through the third groove K3, and GB1 and GB2 provide a negative-phase clock signal. When GB1 is lapped onto GB2, it is able to reduce a resistance of a signal line providing the negative-phase clock signal. GK1 is lapped onto GK2 through the fourth groove K4, and GK1 and GK2 provide a positive-phase clock signal. When GK1 is lapped onto GK2, it is able to reduce a resistance of a signal line providing the positive-phase clock signal.

As shown in FIG. 5, an orthogonal projection of the second voltage line VS2 onto the substrate covers the orthogonal projection of the first voltage line VS1 onto the substrate, covers a part of the first scanning driving circuit region EA1, and covers a part of the orthogonal projection of the alternating current signal line GS1 onto the substrate.

In at least one embodiment of the present disclosure, a plurality of protrusions and a plurality of recesses are arranged alternately at an edge of the second voltage line close to the display region, and each protrusion protrudes towards the display region, i.e., the edge of the second voltage line close to the display region is of a wave-like shape.

During the implementation, an orthogonal projection of the edge of the second voltage line close to the display region onto the substrate is at least partially located within the orthogonal projection of the alternating current signal line onto the substrate.

In a possible embodiment of the present disclosure, the orthogonal projection of the edge of the second voltage line close to the display region onto the substrate is, but not limited to, located within the orthogonal projection of the alternating current signal line onto the substrate.

In FIG. 5, the edge of the second voltage line VS2 close to the display region (the display region is arranged at a side of the second scanning driving circuit region GA1 away from the first scanning driving circuit region EA1) is a right edge.

As shown in FIG. 5, a plurality of protrusions 51 and a plurality of recesses 52 are arranged at the right edge of VS2. In FIG. 5, each of the protrusions 51 and the recesses 52 is of a rectangular shape. In actual use, the protrusions 51 and the recesses 52 may also be of any other shape.

In a possible embodiment of the present disclosure, each of the protrusions and the recesses is of, but not limited to, a rectangular shape, a trapezoidal shape or an arc-like shape.

During the implementation, the first voltage line is arranged on the first conductive layer, the second voltage line is arranged on the second conductive layer, and the first insulation layer is arranged between the first conductive layer and the second conductive layer. A first scanning driving circuit region is arranged between the first voltage line and the alternating current signal line. A portion of the second voltage line corresponding to the first scanning driving circuit region is provided with a plurality of first openings for air exhaust, so as to prevent the first insulation layer from being bulged up. An orthogonal projection of the portion of the second voltage line corresponding to the first scanning driving circuit region partially overlaps an orthogonal projection of the first scanning driving circuit region onto the substrate.

In at least one embodiment of the present disclosure, a minimum distance d2 between the first opening and the edge of the second voltage line close to the display region is within a second predetermined distance range, so as to ensure a minimum critical dimension for the formation of the first opening and the recess through exposure.

In a possible embodiment of the present disclosure, the second predetermined distance range is, but not limited to, greater than or equal to 2.5 μm.

As shown in FIG. 5, the portion of the second voltage line VS2 corresponding to the first scanning driving circuit region EA1 is provided with a plurality of first openings H1 for air exhaust, so as to prevent the first insulation layer from being bulged up.

In general cases, one row of pixels correspond to two rows of first openings, and the first openings in two adjacent columns are arranged in a staggered manner.

In FIG. 5, a longitudinal length of the recess 52 is, but not limited to, equal to a longitudinal length of the first opening H1, and an arrangement mode of the recesses 52 is, but not limited to, the same as that of the first openings H1.

In actual use, the recesses 52 may also be arranged according to a different rule in the case of a special design.

In at least one embodiment of the present disclosure, a ratio of a maximum length W1 of the recess in a first direction to a maximum length W2 of the protrusion in the first direction, i.e., W1/W2, is within a second predetermined ratio range, and the first direction is same as an extension direction of the alternating current signal line.

In a possible embodiment of the present disclosure, the second predetermined ratio range is greater than or equal to 0.5 and smaller than or equal to 2.

During the implementation, the ratio W1/W2 may increase at a position where the width of the second voltage line VS2 is sufficiently large, e.g., at each rounded-corner region, and the ratio W1/W2 needs to decrease at a position where the width of the second voltage line VS2 is insufficiently large, e.g., at a transition region between the side region and the rounded-corner region. In other words, the ratio W1/W2 may be adjusted flexibly according to the practical need.

Figure 6A:
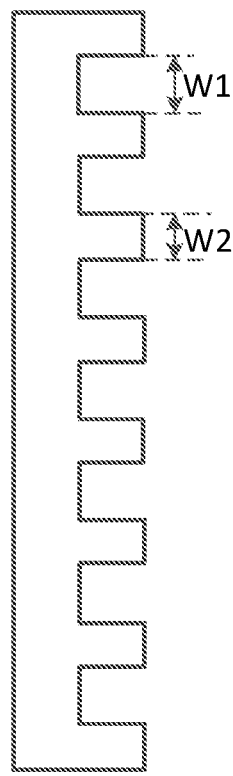
FIG. 6A is a schematic view showing an overlapping region between an orthogonal projection of a second voltage line VS2 onto a substrate and an orthogonal projection of an alternating current signal line GS1 onto the substrate according to one embodiment of the present disclosure.
Figure 6B:
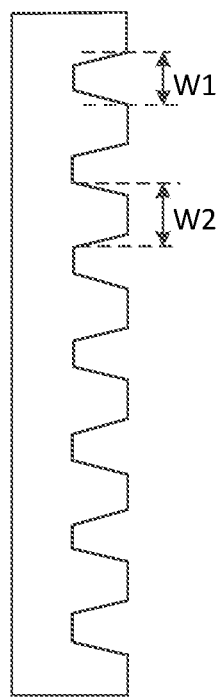
FIG. 6B is another schematic view showing the overlapping region between the orthogonal projection of the second voltage line VS2 onto the substrate and the orthogonal projection of the alternating current signal line GS1 onto the substrate according to one embodiment of the present disclosure.
Figure 6C:
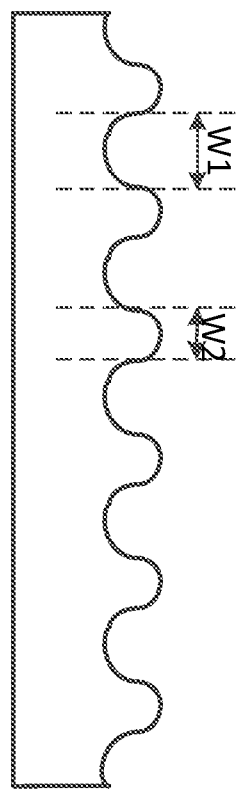
FIG. 6C is yet another schematic view showing the overlapping region between the orthogonal projection of the second voltage line VS2 onto the substrate and the orthogonal projection of the alternating current signal line GS1 onto the substrate according to one embodiment of the present disclosure.

In FIGS. 6A, 6B and 6C, the first direction is a longitudinal direction. FIGS. 6A, 6B and 6C show a part of the overlapping region between the orthogonal projection of the second voltage line VS2 onto the substrate and the orthogonal projection of the alternating current signal line GS1 onto the substrate.

As shown in FIG. 6A, the recesses 52 and the protrusions 51 are arranged at the right edge of the second voltage line VS2, and each of the recesses 52 and the protrusions 51 is of a rectangular shape.

As shown in FIG. 6B, the recesses 52 and the protrusions 51 are arranged at the right edge of the second voltage line VS2, and each of the recesses 52 and the protrusions 51 is of a trapezoidal shape.

As shown in FIG. 6C, the recesses 52 and the protrusions 51 are arranged at the right edge of the second voltage line VS2, and each of the recesses 52 and the protrusions 51 is of an arc-like shape.

W1 and W2 are shown in FIGS. 6A, 6B and 6C.

In at least one embodiment of the present disclosure, a shape of the first opening corresponds to the shape of the protrusion and the shape of the recess, so as to facilitate the manufacture. However, the shape of the first opening will not be particularly defined herein.

When the shape of the first opening corresponds to the shape of the protrusion and the shape of the recess, it means that the first openings in a same column are cut along the first direction to form the protrusions and the recesses, so that the shape of the protrusions and the shape of the recesses correspond to the shape of the first openings.

For example, when each of the recesses 52 and the protrusions 51 is of a rectangular shape, the first opening H1 is of a rectangular shape, and when each of the recesses 52 and the protrusions 51 is of a trapezoidal shape, the first opening H1 is of a polygonal shape (e.g., a hexagonal or octagonal shape).

Figure 23A:
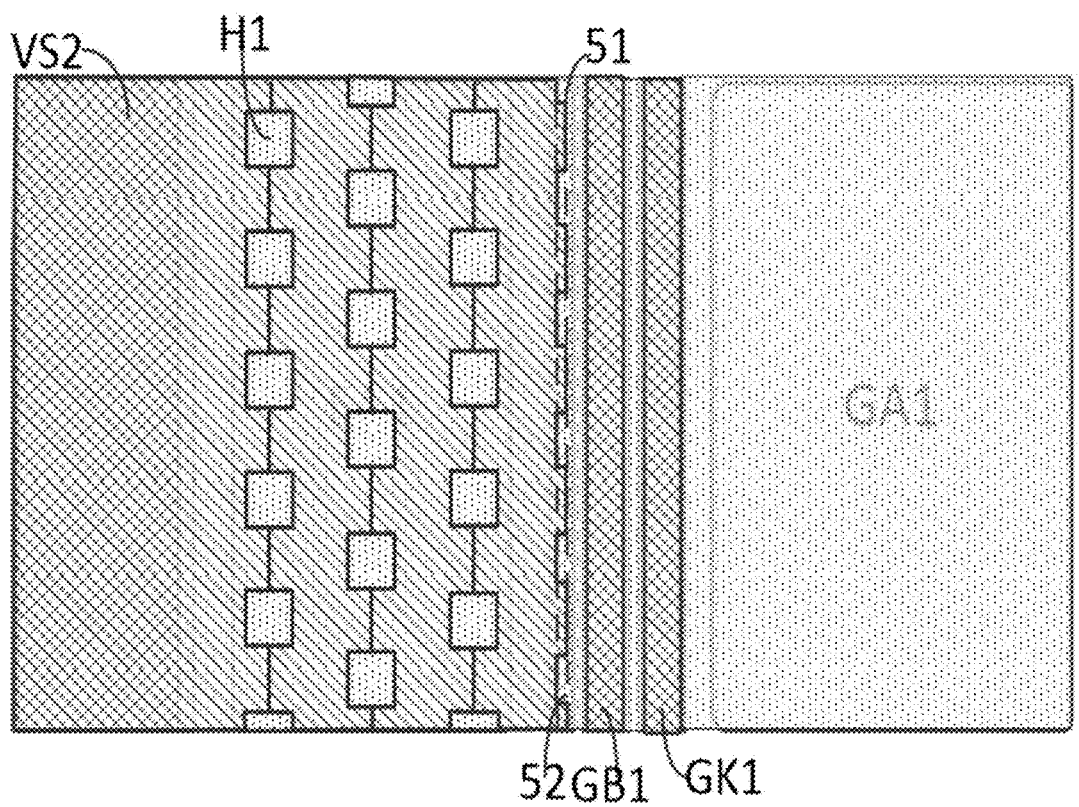
FIG. 23A is an enlarged view of FIG. 5.

As shown in FIG. 23A which is an enlarged view of FIG. 5, a ratio of the area of the overlapping region between the orthogonal projection of the second voltage line VS2 onto the substrate and the orthogonal projection of the alternating current signal line GS1 onto the substrate to the area of the orthogonal projection of the alternating current signal line GS1 onto the substrate is 0.57.

Figure 23B:
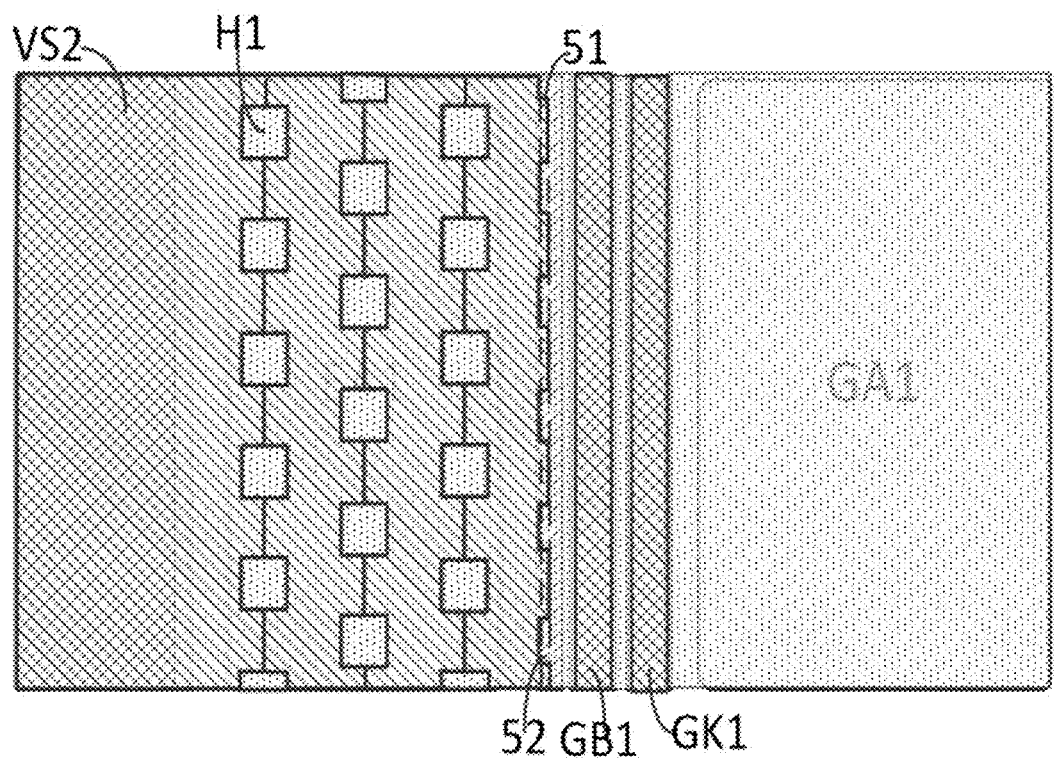
FIG. 23B is a schematic view showing the superimposition of the first conductive layer, the first insulation layer and the second conductive layer according to one embodiment of the present disclosure.

FIG. 23B differs from FIG. 23A in that the right edge of the second voltage line VS2 moves to the left so that an orthogonal projection of a left edge of the recess 52 onto the substrate corresponds to the orthogonal projection of the alternating current signal line GS1 onto the substrate. At this time, the ratio of the area of the overlapping region between the orthogonal projection of the second voltage line VS2 onto the substrate and the orthogonal projection of the alternating current signal line GS1 onto the substrate to the area of the orthogonal projection of the alternating current signal line GS1 onto the substrate is 0.2.

Figure 23C:
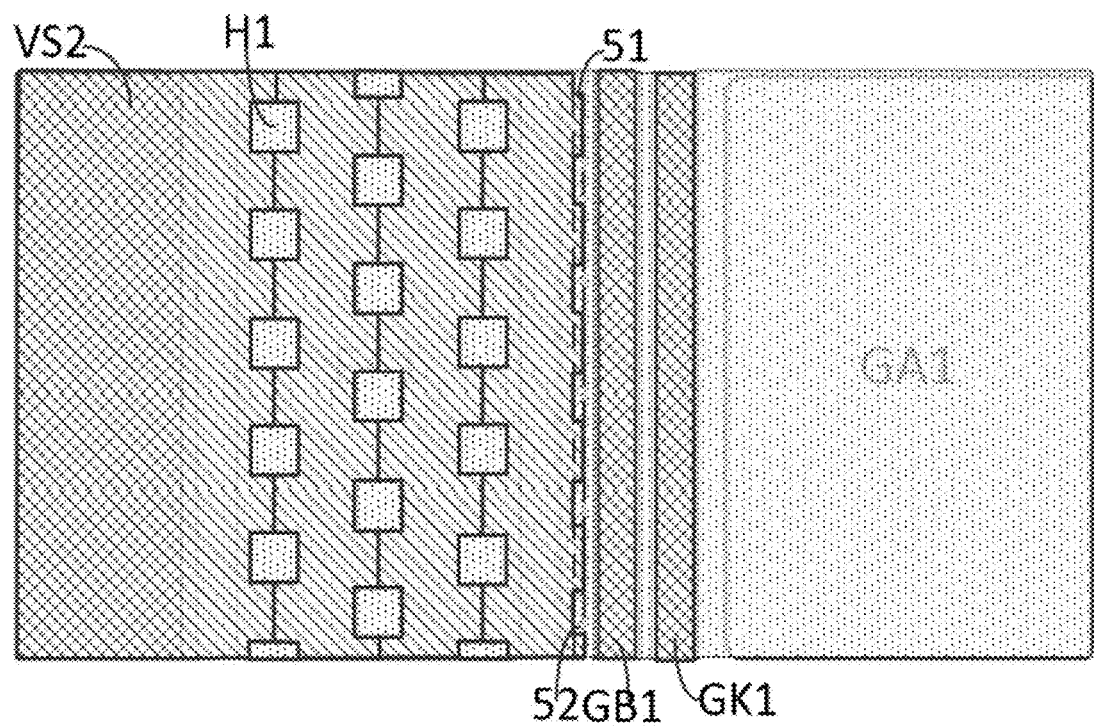
FIG. 23C is another schematic view showing the superimposition of the first conductive layer, the first insulation layer and the second conductive layer according to one embodiment of the present disclosure.

FIG. 23C differs from FIG. 23A in that the right edge of the second voltage line VS2 moves to the right so that an orthogonal projection of a right edge of the protrusion 51 onto the substrate corresponds to the orthogonal projection of the alternating current signal line GS1 onto the substrate. At this time, the ratio of the area of the overlapping region between the orthogonal projection of the second voltage line VS2 onto the substrate and the orthogonal projection of the alternating current signal line GS1 onto the substrate to the area of the orthogonal projection of the alternating current signal line GS1 onto the substrate is 0.8.

In a possible embodiment of the present disclosure, the ratio of the area of the overlapping region between the orthogonal projection of the second voltage line VS2 onto the substrate and the orthogonal projection of the alternating current signal line GS1 onto the substrate to the area of the orthogonal projection of the alternating current signal line GS1 onto the substrate is greater than or equal to 0.2 and smaller than or equal to 0.8. For example, the area of the overlapping region between the orthogonal projection of the second voltage line VS2 onto the substrate and the orthogonal projection of the alternating current signal line GS1 onto the substrate to the area of the orthogonal projection of the alternating current signal line GS1 onto the substrate is, but not limited to, 0.2, 0.25, 0.3, 0.35, 0.4, 0.45, 0.5, 0.55, 0.6, 0.65, 0.7, 0.75 or 0.8.

Figure 23D:
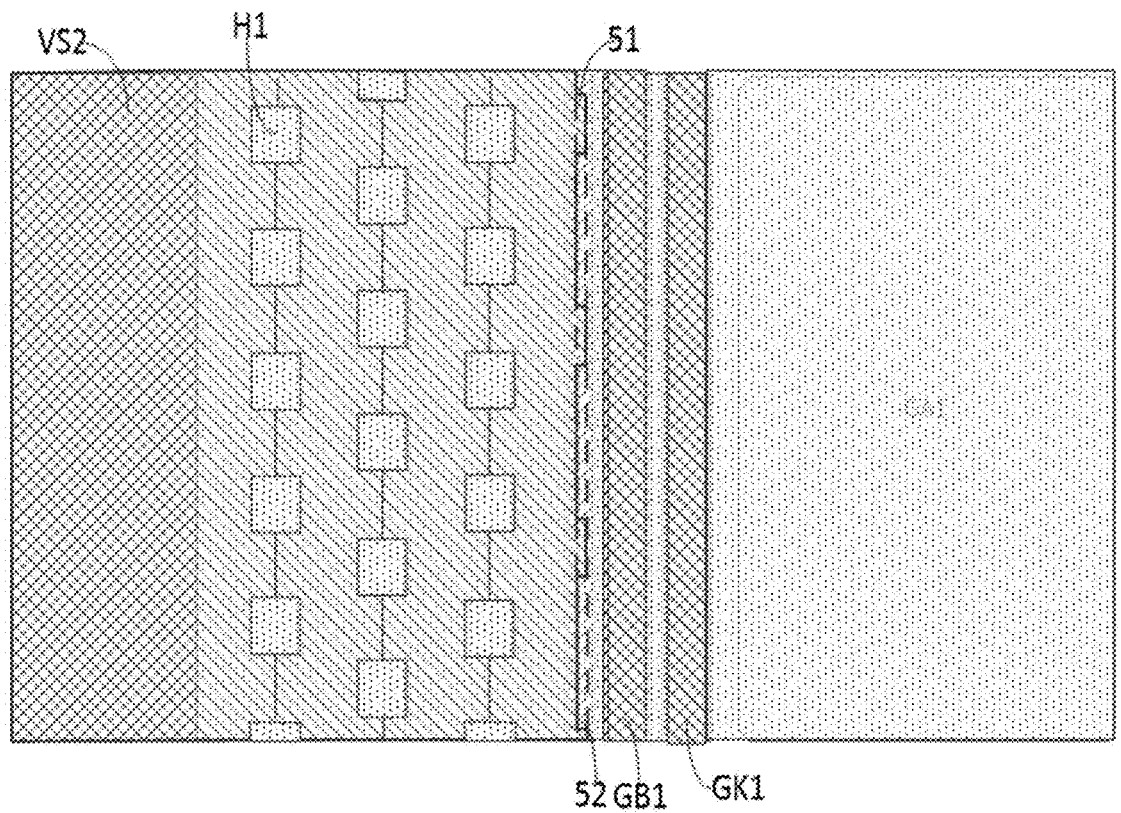
FIG. 23D is yet another schematic view showing the superimposition of the first conductive layer, the first insulation layer and the second conductive layer according to one embodiment of the present disclosure.

FIG. 23D differs from FIG. 23A in that the ratio of the maximum length W1 of the recess 52 in the first direction to the maximum length W2 of the protrusion 51 in the first direction is relatively large (e.g., 1.5). At this time, the ratio of the area of the overlapping region between the orthogonal projection of the second voltage line VS2 onto the substrate and the orthogonal projection of the alternating current signal line GS1 onto the substrate to the area of the orthogonal projection of the alternating current signal line GS1 onto the substrate is 0.43.

Figure 23E:
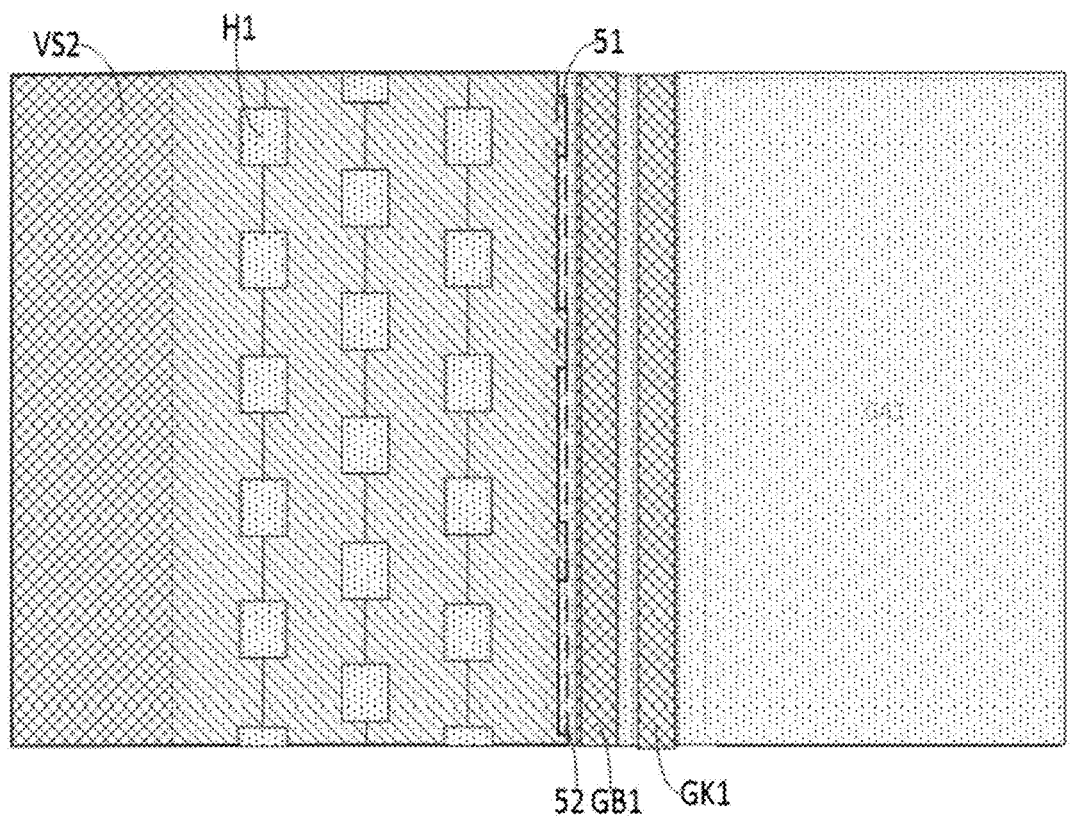
FIG. 23E is still yet another schematic view showing the superimposition of the first conductive layer, the first insulation layer and the second conductive layer according to one embodiment of the present disclosure.

FIG. 23E differs from FIG. 23A in that the ratio of the maximum length W1 of the recess 52 in the first direction to the maximum length W2 of the protrusion 51 in the first direction is relatively large (e.g., 1.5). At this time, the ratio of the area of the overlapping region between the orthogonal projection of the second voltage line VS2 onto the substrate and the orthogonal projection of the alternating current signal line GS1 onto the substrate to the area of the orthogonal projection of the alternating current signal line GS1 onto the substrate is 0.5.

Figure 23F:
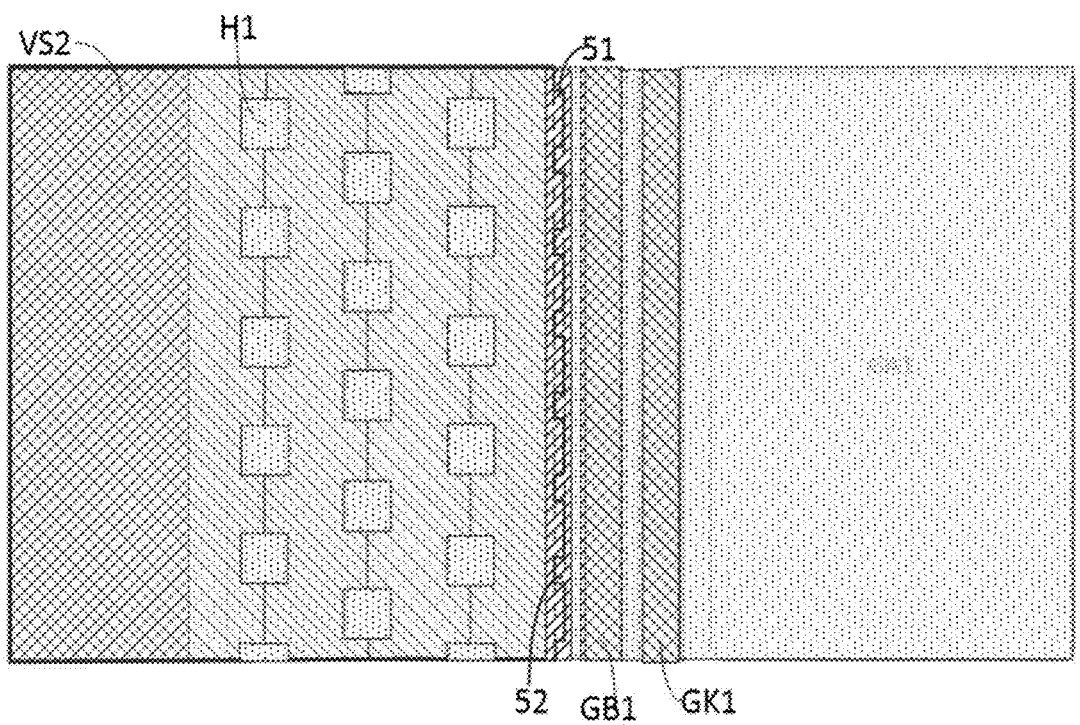
FIG. 23F is still yet another schematic view showing the superimposition of the first conductive layer, the first insulation layer and the second conductive layer according to one embodiment of the present disclosure.

FIG. 23F differs from FIG. 23A in that the ratio of the maximum length W1 of the recess 52 in the first direction to the maximum length W2 of the protrusion 51 in the first direction is relatively large (e.g., 0.5). At this time, the ratio of the area of the overlapping region between the orthogonal projection of the second voltage line VS2 onto the substrate and the orthogonal projection of the alternating current signal line GS1 onto the substrate to the area of the orthogonal projection of the alternating current signal line GS1 onto the substrate is 0.87.

Figure 23G:
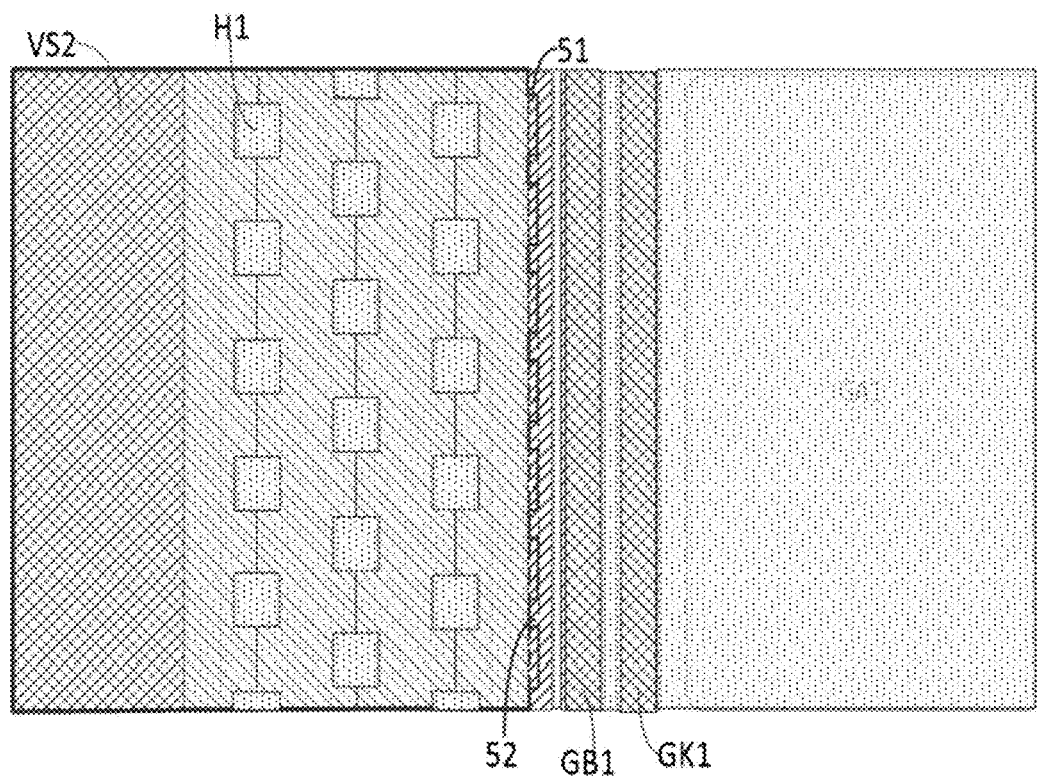
FIG. 23G is still yet another schematic view showing the superimposition of the first conductive layer, the first insulation layer and the second conductive layer according to one embodiment of the present disclosure.

FIG. 23G differs from FIG. 23B in that the ratio of the maximum length W1 of the recess 52 in the first direction to the maximum length W2 of the protrusion 51 in the first direction is relatively large (e.g., 0.5). At this time, the ratio of the area of the overlapping region between the orthogonal projection of the second voltage line VS2 onto the substrate and the orthogonal projection of the alternating current signal line GS1 onto the substrate to the area of the orthogonal projection of the alternating current signal line GS1 onto the substrate is 0.25.

Figure 23H:
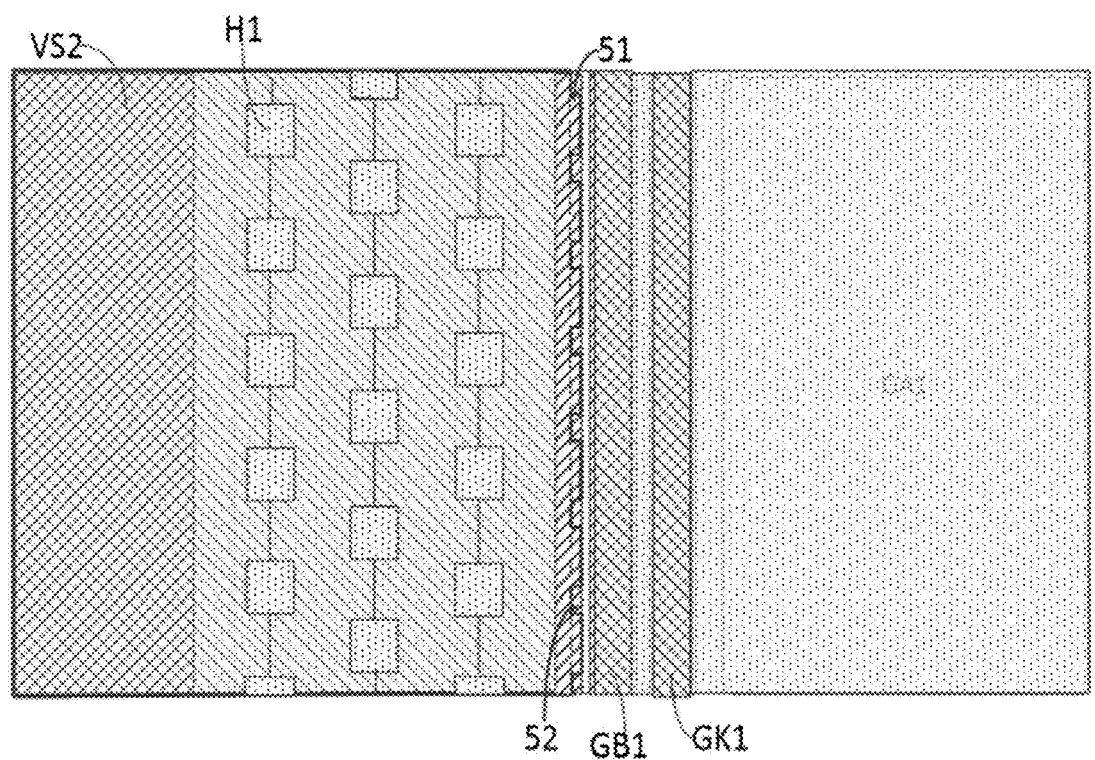
FIG. 23H is still yet another schematic view showing the superimposition of the first conductive layer, the first insulation layer and the second conductive layer according to one embodiment of the present disclosure.

FIG. 23H differs from FIG. 23C in that the ratio of the maximum length W1 of the recess 52 in the first direction to the maximum length W2 of the protrusion 51 in the first direction is relatively large (e.g., 0.5). At this time, the ratio of the area of the overlapping region between the orthogonal projection of the second voltage line VS2 onto the substrate and the orthogonal projection of the alternating current signal line GS1 onto the substrate to the area of the orthogonal projection of the alternating current signal line GS1 onto the substrate is 0.9.

In at least one embodiment of the present disclosure, the display substrate further includes a first conductive connection member and a light-emitting element arranged on the substrate, and a third conductive layer arranged at a side of the second conductive layer away from the substrate. The first conductive connection member and an anode of the light-emitting element are arranged on the third conductive layer, the first conductive connection member is separated from the anode of the light-emitting element, and the first conductive connection member is lapped onto the second voltage line, so as to further reduce the resistance of the signal line including the first voltage line and the second voltage line.

During the implementation, the third conductive layer is an anode layer.

In at least one embodiment of the present disclosure, the first conductive connection member and the anode of the light-emitting element are arranged on the third conductive layer, and the second voltage line is arranged on the second conductive layer. The display substrate further includes a second insulation layer arranged between the third conductive layer and the second conductive layer, the second insulation layer is provided with a second groove and a plurality of second openings, the first conductive connection member is lapped onto the second voltage line through the second groove and the second opening, and an orthogonal projection of the second groove onto the substrate at least partially overlaps an orthogonal projection of the first groove onto the substrate.

During the implementation, an aperture ratio of the second opening is 20% to 25%. Usually, one row of pixels correspond to two rows of second openings, and the second openings in two adjacent columns are arranged in a staggered manner.

In a possible embodiment of the present disclosure, the second insulation layer is a second planarization layer.

During the implementation, the second insulation layer and the anode layer are formed sequentially at a side of the first insulation layer away from the substrate, and the second insulation layer is provided with a plurality of second openings. The anode layer is patterned to form the first conductive connection member and the anode of the light-emitting element. The first conductive connection member is separated from the anode of the light-emitting element, and lapped onto the second voltage line through the second opening, so as to further reduce the resistance.

In at least one embodiment of the present disclosure, the first conductive connection member is provided with a plurality of third openings for air exhaust, so as to prevent the second insulation layer from being bulged up.

Figure 7:
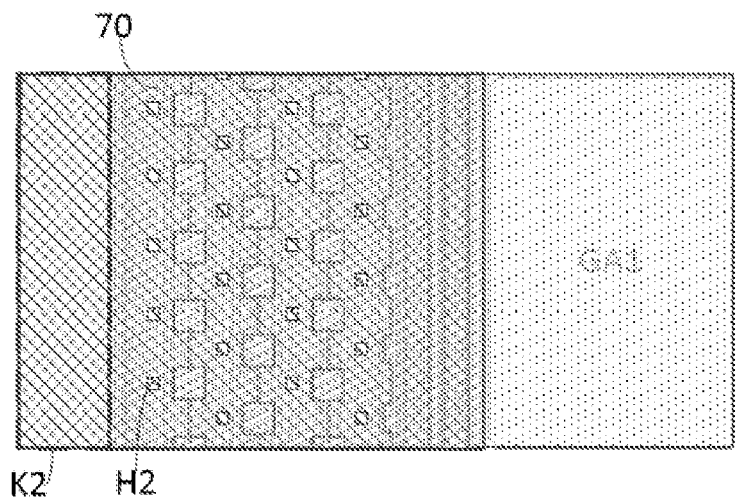
FIG. 7 is a schematic view showing the superimposition of the first conductive layer, the first insulation layer, the second conductive layer and a second insulation layer according to one embodiment of the present disclosure.

As shown in FIG. 7, the second insulation layer 70 (the second planarization layer) is formed at a side of the second conductive layer away from the substrate, and the second groove K2 and the plurality of second openings H2 are formed in the second insulation layer 70.

In at least one embodiment of the present disclosure, an area of the first opening H1 is greater than an area of the second opening H2.

In FIG. 7, an orthogonal projection of the second groove K2 onto the substrate overlaps an orthogonal projection of the first groove K1 onto the substrate, and an orthogonal projection of the second insulation layer 70 onto the substrate does not covers the second scanning driving circuit region GA1.

Figure 8:
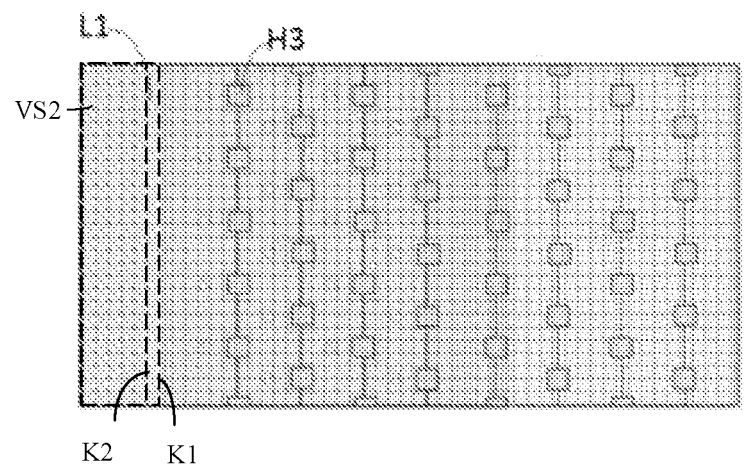
FIG. 8 is a schematic view showing the superimposition of the first conductive layer, the first insulation layer, the second conductive layer, the second insulation layer and a third conductive layer according to one embodiment of the present disclosure.

As shown in FIG. 8, a third conductive layer is formed at a side of the second insulation layer away from the substrate, and FIG. 8 shows a first conductive connection member L1 included in the third conductive layer. The first conductive connection member L1 is lapped onto the second voltage line VS2 through the second groove K2 and the second opening H2, so as to further reduce the resistance of the signal line including the first voltage line VS1 and the second voltage line VS2.

The first conductive connection member L1 is separated from the anode of the light-emitting element (the anode of the light-emitting element is arranged at the display region).

In FIG. 8, the first conductive connection member L1 is provided with a plurality of third openings H3 for air exhaust, so as to prevent the second insulation layer from being bulged up.

In at least one embodiment of the present disclosure, the display substrate further includes a pixel definition layer arranged at a side of the third conductive layer away from the substrate, the pixel definition layer includes a plurality of protection patterns, an orthogonal projection of each protection pattern onto the substrate fully covers an orthogonal projection of a corresponding third opening onto the substrate to protect the third opening, and there is a gap between the adjacent protection patterns.

Figure 9:
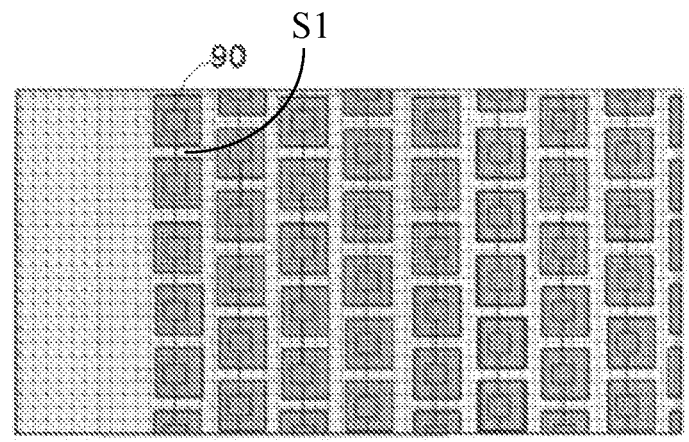
FIG. 9 is a schematic view showing the superimposition of the first conductive layer, the first insulation layer, the second conductive layer, the second insulation layer, the third conductive layer and a pixel definition layer according to one embodiment of the present disclosure.

As shown in FIG. 9, the pixel definition layer is arranged at a side of the third conductive layer away from the substrate. The pixel definition layer includes the plurality of protection patterns 90, and the orthogonal projection of each protection pattern 90 onto the substrate fully covers the orthogonal projection of the corresponding third opening H3 onto the substrate to protect the third opening H3. There is a gap S1 between the adjacent protection patterns 90, so as to facilitate the lapping of the second conductive connection member onto the first conductive connection member.

In at least one embodiment of the present disclosure, the display substrate further includes a second conductive connection member, and a fourth conductive layer arranged at a side of the third conductive layer away from the substrate. The second conductive connection member and a cathode of the light-emitting element are arranged on the fourth conductive layer, the second conductive connection member is electrically coupled to the cathode of the light-emitting layer and configured to provide a low voltage signal to the cathode of the light-emitting layer, and the second conductive connection member is lapped onto the first conductive connection member through the gap.

During the implementation, the fourth conductive layer is a cathode layer.

Figure 10:
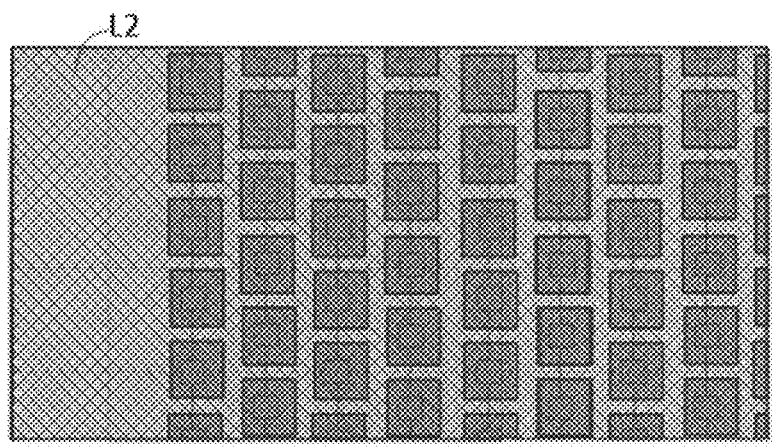
FIG. 10 is a schematic view showing the layout of the display substrate according to one embodiment of the present disclosure.

As shown in FIG. 10, the cathode layer is formed at a side of the pixel definition layer away from the substrate, and then patterned to form the second conductive connection member L2 and the cathode of the light-emitting element (the cathode of the light-emitting element is arranged at the display region). The second conductive connection member L2 is electrically coupled to the cathode of the light-emitting element, so as to provide a low voltage signal to the cathode of the light-emitting element. The second conductive connection member L2 is lapped onto the first conductive connection member L1 through the gap between the adjacent protection patterns 90.

In at least one embodiment of the present disclosure, the signal line including the first voltage line VS1, the second voltage line VS2, the first conductive connection member L1 and the second conductive connection member L2 is used to transmit a lot voltage signal, and it has a small resistance.

Figure 11:
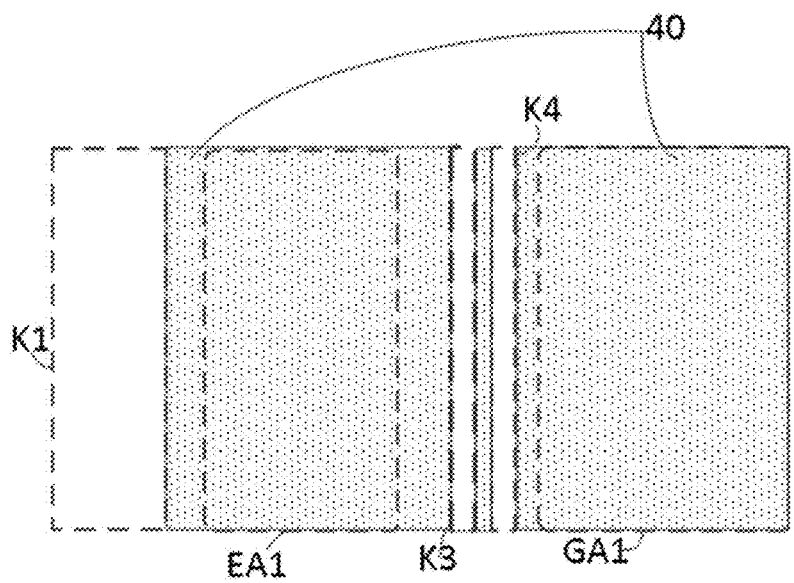
FIG. 11 is a schematic view showing the layout of the first insulation layer in FIG. 10.
Figure 12:
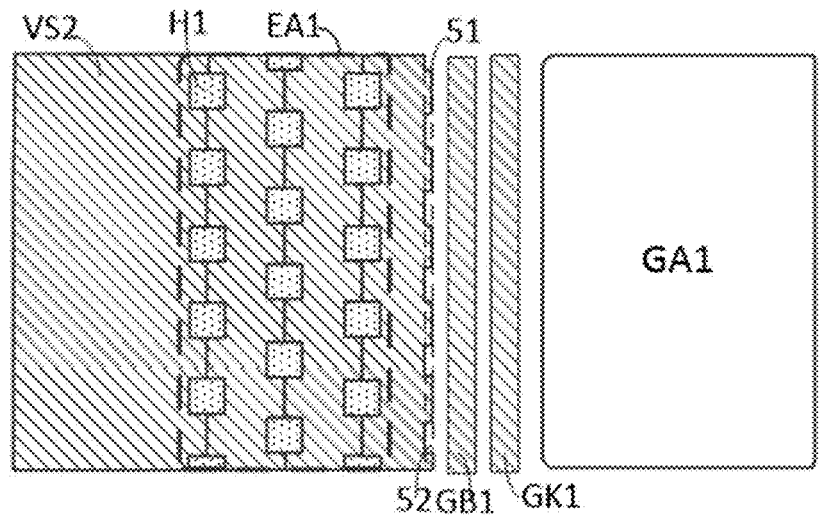
FIG. 12 is a schematic view showing the layout of the second conductive layer in FIG. 10.
Figure 13:
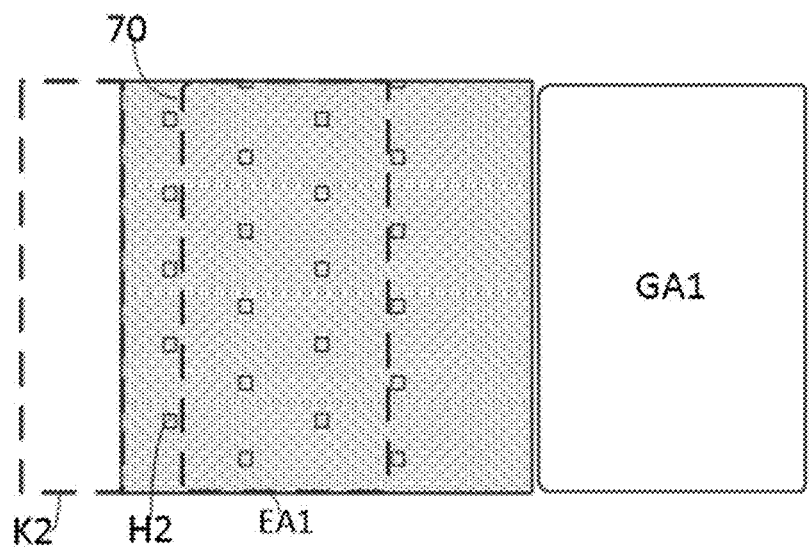
FIG. 13 is a schematic view showing the layout of the second insulation layer in FIG. 10.
Figure 14:
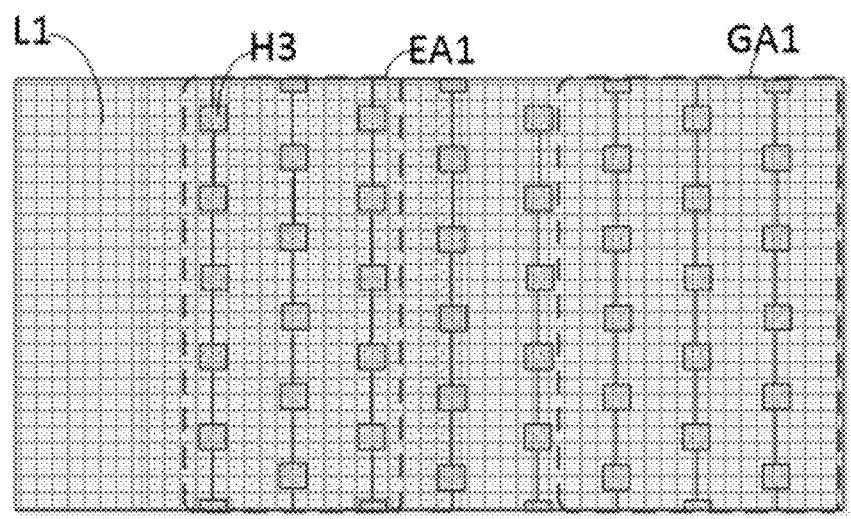
FIG. 14 is a schematic view showing the layout of the third conductive layer in FIG. 10.
Figure 15:
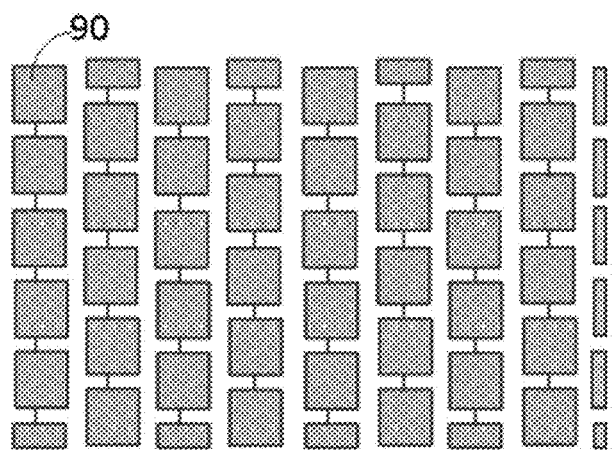
FIG. 15 is a schematic view showing the layout of the pixel definition layer in FIG. 10.
Figure 16:
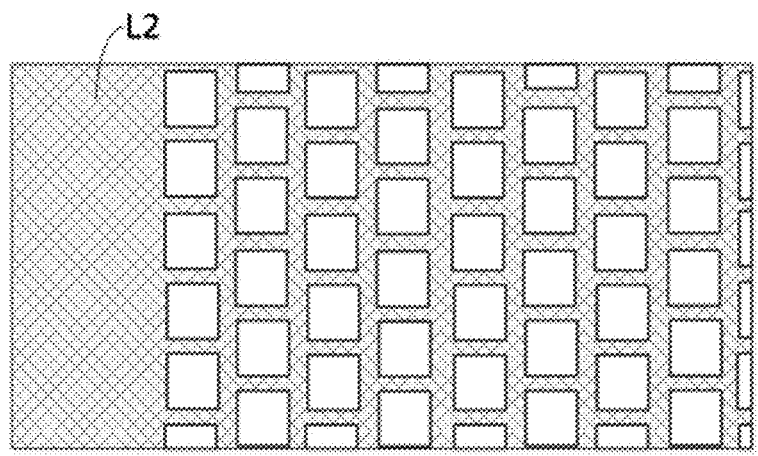
FIG. 16 is a schematic view showing the layout of a fourth conductive layer in FIG. 10.

FIG. 11 shows the layout of the first insulation layer in FIG. 10, FIG. 12 shows the layout of the second conductive layer in FIG. 10, FIG. 13 shows the layout of the second insulation layer in FIG. 10, FIG. 14 shows the layout of the third conductive layer in FIG. 10, FIG. 15 shows the layout of the pixel definition layer in FIG. 10, and FIG. 16 shows the layout of the fourth conductive layer in FIG. 10.

Figure 17:
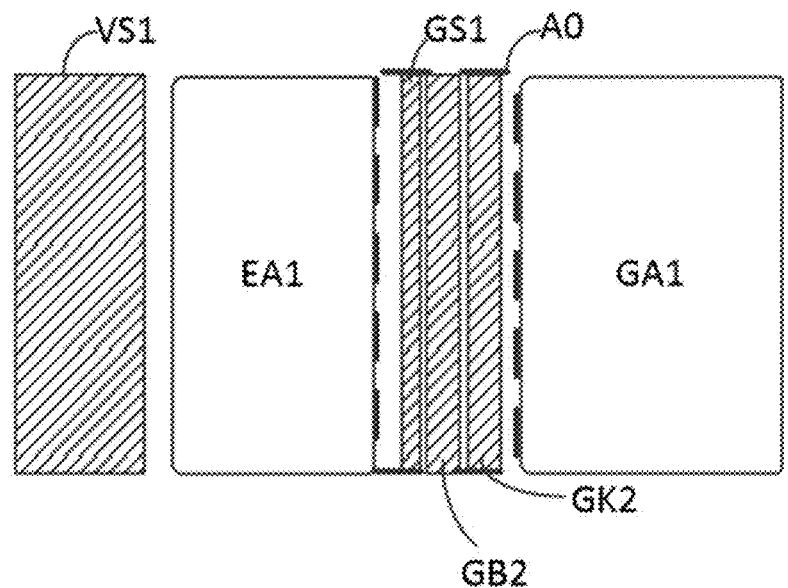
FIG. 17 is a schematic view showing the layout of the first conductive layer in FIG. 22.

In a possible embodiment of the present disclosure, as shown in FIG. 17, a second scanning driving circuit region GA1 is arranged at a side of the alternating current signal line GS1 away from the first voltage line VS1, and a spacing region A0 is arranged between the first scanning driving circuit region EA1 and the second scanning driving circuit region GA1.

Figure 19:
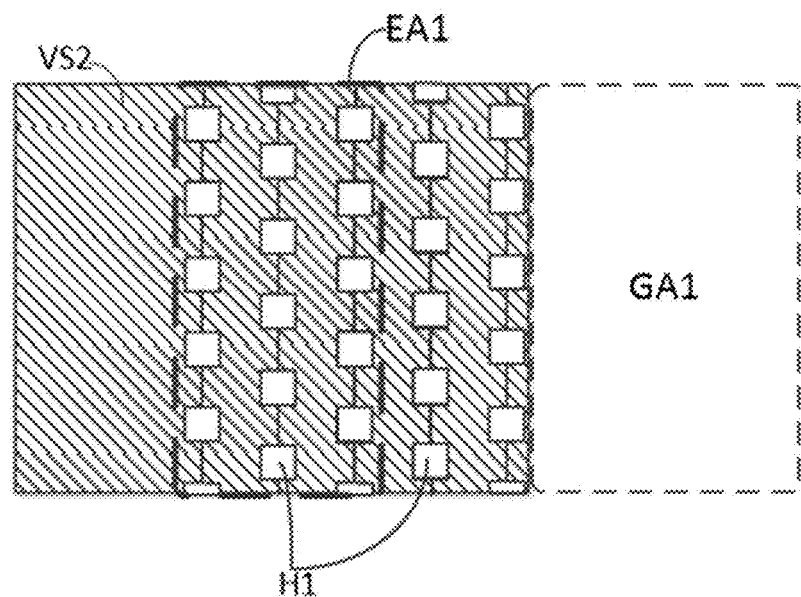
FIG. 19 is a schematic view showing the layout of the second conductive layer in FIG. 22.

As shown in FIG. 19, the second voltage line VS2 includes a portion corresponding to the spacing region A0, a plurality of first openings H1 is formed in the portion of the second voltage line VS2 corresponding to the spacing region A0, and the alternating current signal line GS1 is arranged at the spacing region A0.

As shown in FIG. 17, in at least one embodiment of the present disclosure, the display substrate further includes a second clock signal line GB2 and a fourth clock signal line GK2 both arranged at the spacing region A0, and the second clock signal line GB2 and the fourth clock signal line GK2 are arranged on the first conductive layer.

Figure 18:
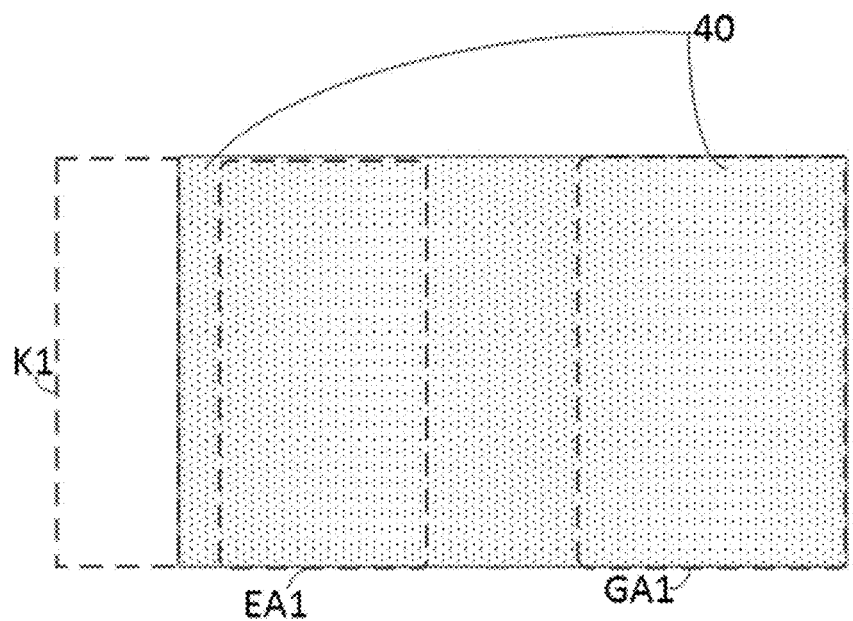
FIG. 18 is a schematic view showing the layout of the first insulation layer in FIG. 22.

FIG. 18 differs from FIG. 4 in that no third groove K3 and fourth groove K4 are provided.

In FIG. 19, the first clock signal line GB1 and the third clock signal line GK1 are not provided. The second voltage line VS2 extends towards the right to an edge of GA1, and a portion of the second voltage line VS2 corresponding to EA1 and a portion of the second voltage line corresponding to A0 are provided with a plurality of openings H1.

Figure 21:
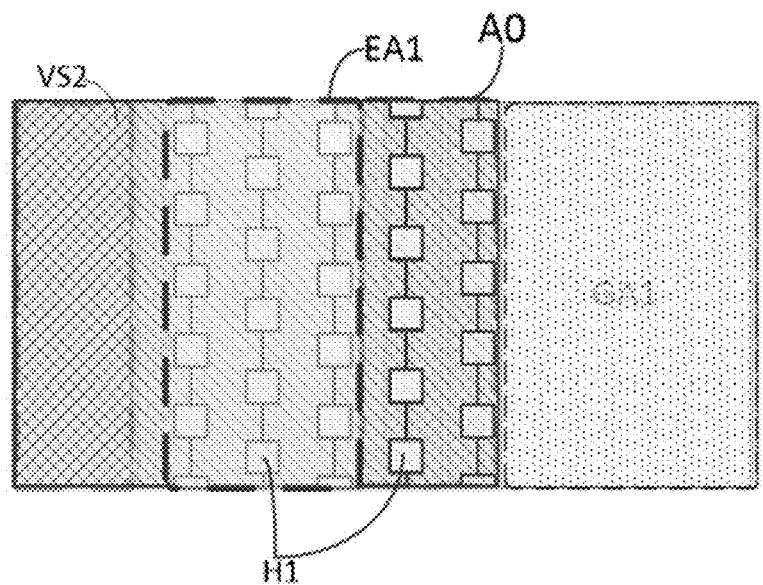
FIG. 21 is a schematic view showing the superimposition of the second conductive layer on the basis of FIG. 20.

As shown in FIG. 21, orthogonal projections of at least a part of the openings H1 onto the substrate at least partially overlap an orthogonal projection of the alternating current signal line GS1 onto the substrate, so that the ratio of the area of the overlapping region between the orthogonal projection of the second voltage line VS2 onto the substrate and the orthogonal projection of the alternating current signal line GS1 onto the substrate to the area of the orthogonal projection of the alternating current signal line GS1 onto the substrate is within the first predetermined ratio range. In this way, it is able to reduce the interference caused by the second voltage line VS2 on the alternating current signal provided by the alternating current signal line GS1 and output the alternating current signal stably, thereby to improve the display uniformity.

In addition, as shown in FIG. 21, orthogonal projections of at least a part of the openings H1 onto the substrate at least partially overlap an orthogonal projection of the second clock signal line GB2 onto the substrate, and orthogonal projections of at least a part of the openings H1 onto the substrate at least partially overlap an orthogonal projection of the fourth clock signal line GK2 onto the substrate, i.e., a part of the openings H1 are formed above each of the second clock signal line GB2 and the fourth clock signal line GK2. In this way, it is able to prevent a second clock signal provided by GB2 and a fourth clock signal provided by GK2 from being adversely affected by the second voltage line, thereby to output the clock signal stably.

Figure 20:
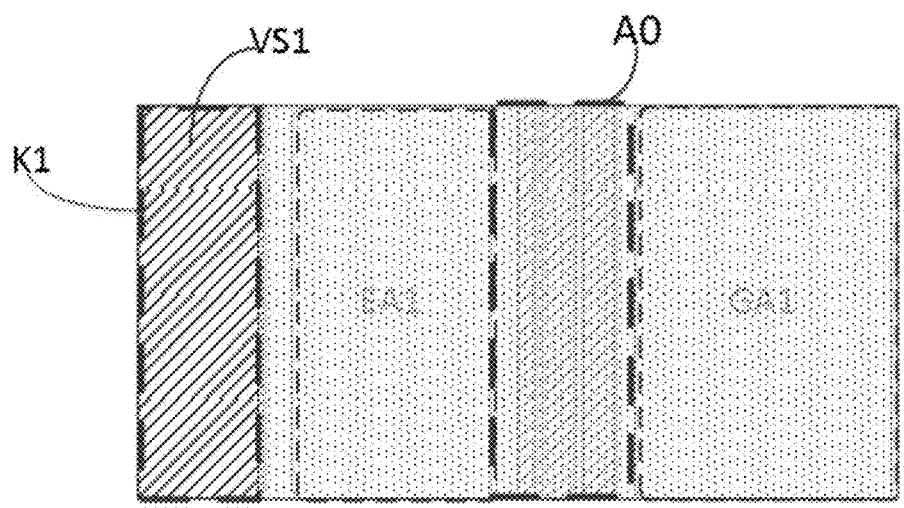
FIG. 20 is a schematic view showing the superimposition of the first conductive layer in FIG. 17 and the first insulation layer in FIG. 18.
Figure 22:
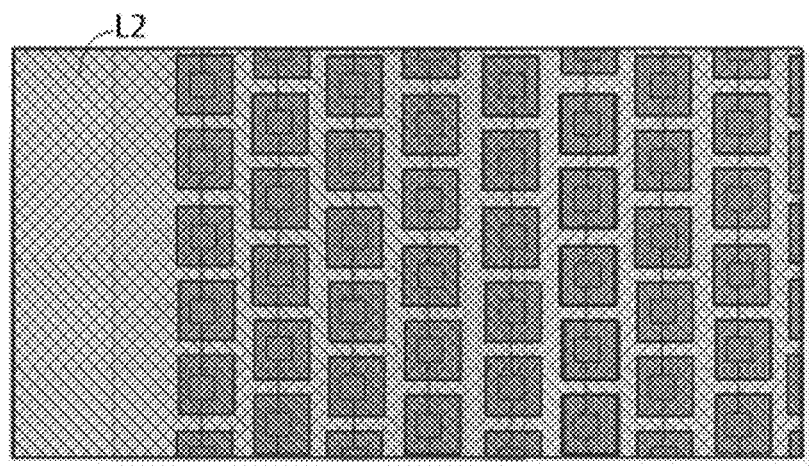
FIG. 22 is another schematic view showing the layout of the display substrate according to one embodiment of the present disclosure.

FIG. 22 shows the layout of the display substrate, FIG. 17 shows the layout of the first conductive layer in FIG. 22, FIG. 18 shows the layout of the first insulation layer in FIG. 22, FIG. 19 shows the layout of the second conductive layer in FIG. 22, FIG. 20 shows the superimposition of the first conductive layer in FIG. 17 and the first insulation layer in FIG. 18, and FIG. 21 shows the superimposition of the second conductive layer on the basis of FIG. 20.

For the display substrate in FIG. 22, FIG. 13 shows the layout of the second insulation layer, FIG. 14 shows the layout of the third conductive layer, FIG. 15 shows the layout of the pixel definition layer, and FIG. 16 shows the layout of the fourth conductive layer.

In a possible embodiment of the present disclosure, the non-display region includes a first side region, a second side region, a third side region, a fourth side region and four rounded-corner regions, the first side region is arranged opposite to the second side region, and the third side region is arranged opposite to the fourth side region. A scanning driving circuit is arranged at each of the four rounded-corner regions, the first side region and the second side region, and the second voltage line is arranged at each of the first side region, the second side region and the four rounded-corner regions.

In at least one embodiment of the present disclosure, the design of the second voltage line is adapted to the first side region, the second side region and the four rounded-corner regions.

The third side region is an upper side region, the fourth side region is a lower side region, and a driving Integrated Circuit (IC) is arranged at the lower side region. At the upper side region, a low voltage line plays a limited role, so it is unnecessary to increase the width of the second voltage line, and at this time, there is a gap between the second voltage line and the alternating current signal line. At the lower side region, a groove is formed above the second conductive layer (the groove penetrates the second planarization layer), so no opening is formed in the lower side region. In addition, the low voltage line has a large load at the lower side region, and usually no opening is formed in the lower side region.

Figure 24:
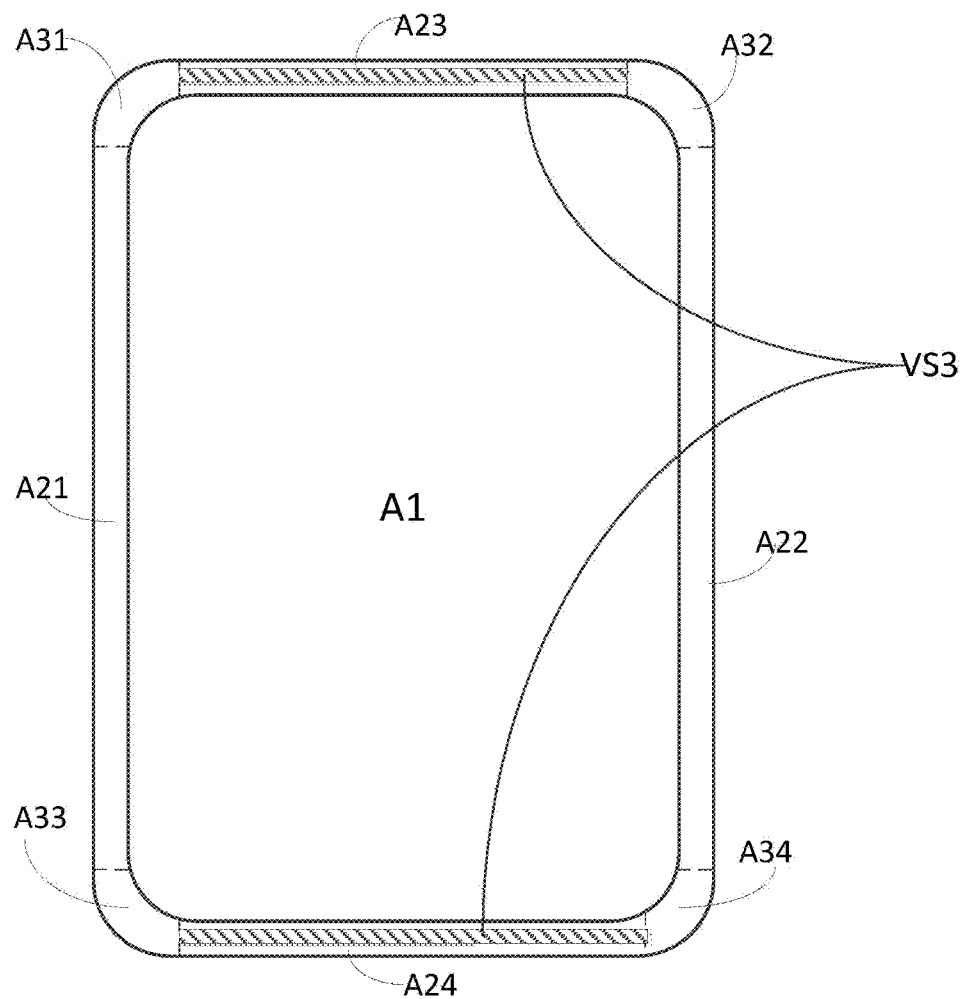
FIG. 24 is a schematic view showing the display substrate in FIG. 2 with an additional third voltage line VS3.

During the implementation, as shown in FIG. 24, a third voltage line VS3 is arranged at each of the third side region A23 and the fourth side region A24, and it is electrically coupled to the second voltage line to transmit a low voltage signal. However, no opening is formed in the third voltage line VS3. The third voltage line VS3 is arranged on, but not limited to, the second conductive layer.

The present disclosure further provides in some embodiments a display device including the above-mentioned display substrate.

In the embodiments of the present disclosure, the display device may be any product or member having a display function, e.g., mobile phone, tablet computer, television, display, laptop computer, digital photo frame or navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a first voltage line, an alternating current signal line and a second voltage line arranged on a substrate, wherein the substrate comprises a display region and a non-display region surrounding the display region, and the first voltage line, the alternating current signal line and the second voltage line are arranged at the non-display region;
   the display substrate further comprises a first conductive layer, a first insulation layer and a second conductive layer laminated sequentially on the substrate, the first voltage line and the alternating current signal line are arranged on the first conductive layer, and the second voltage line is arranged on the second conductive layer;
   the first voltage line is lapped onto the second voltage line through a first groove penetrating through the first insulation layer; and
   an orthogonal projection of the second voltage line onto the substrate overlaps an orthogonal projection of the alternating current signal line onto the substrate at an overlapping region, and a ratio of an area of the overlapping region to an area of the orthogonal projection of the alternating current signal line onto the substrate is within a first predetermined ratio range;
   wherein a plurality of protrusions and a plurality of recesses are arranged alternately at an edge of the second voltage line close to the display region in the overlapping region, and each protrusion protrudes towards the display region.

2. The display substrate according to claim 1, wherein the first predetermined ratio range is greater than or equal to 0.3 and smaller than or equal to 0.8.

3. The display substrate according to claim 1, wherein an orthogonal projection of an edge of the second voltage line close to the display region onto the substrate is located within the orthogonal projection of the alternating current signal line onto the substrate.

4. The display substrate according to claim 1, wherein each of the protrusions and the recesses is of a rectangular shape, a trapezoidal shape, or an arc-like shape.

5. The display substrate according to claim 1, wherein a ratio of a maximum length W1 of the recess in a first direction to a maximum length W2 of the protrusion in the first direction is within a second predetermined ratio range, and
   the first direction is the same as an extension direction of the alternating current signal line,
   wherein the second predetermined ratio range is greater than or equal to 0.5 and smaller than or equal to 2.

6. The display substrate according to claim 1, further comprising a pixel circuit arranged at the display region and a scanning driving circuit arranged at the non-display region,
   wherein the first voltage line and the second voltage line are low voltage lines configured to provide a low voltage signal to a cathode of a light-emitting element in the pixel circuit, and
   the alternating current signal line is an initial voltage line and configured to provide an initial voltage signal to the scanning driving circuit.

7. The display substrate according to claim 1, further comprising a first clock signal line arranged on the substrate, wherein the first clock signal line is arranged at the second conductive layer and at a side of the second voltage line close to the display region, and a minimum distance between the second voltage line and the first clock signal line is within a first predetermined distance range, wherein the first predetermined distance range is greater than or equal to 3 μm.

8. The display substrate according to claim 7, further comprising a second clock signal line, a third clock signal line and a fourth clock signal line, wherein the fourth clock signal line and the second clock signal line are arranged on the first conductive layer, the third clock signal line is arranged on the second conductive layer, the first insulation layer is further provided with a third groove and a fourth groove both penetrating through the first insulation layer, the first clock signal line is lapped onto the second clock signal through the third groove, and the third clock signal line is lapped onto the fourth clock signal line through the fourth groove.

9. The display substrate according to claim 1, wherein a first scanning driving circuit region is arranged between the first voltage line and the alternating current signal line, and a portion of the second voltage line corresponding to the first scanning driving circuit region is provided with a plurality of first openings.

10. The display substrate according to claim 9, wherein a minimum distance between each first opening and the edge of the second voltage line close to the display region is within a second predetermined distance range, wherein the second predetermined distance range is greater than or equal to 2.5 μm.

11. The display substrate according to claim 9, wherein a plurality of protrusions and a plurality of recesses are arranged at an edge of the second voltage line close to the display region, and a shape of the first opening corresponds to a shape of the protrusion and a shape of the recess.

12. The display substrate according to claim 9, wherein a second scanning driving circuit region is arranged at a side of the alternating current signal line away from the first voltage line, a spacing region is arranged between the first scanning driving circuit region and the second scanning driving circuit region, the second voltage line includes a portion corresponding to the spacing region, the portion corresponding to the spacing region is provided with a plurality of first openings, and the alternating current signal line is arranged at the spacing region, wherein the display substrate further comprises a second clock signal line and a fourth clock signal line both arranged at the spacing region, wherein the second clock signal line and the fourth clock signal line are arranged on the first conductive layer.

13. The display substrate according to claim 1, further comprising a first conductive connection member and a light-emitting element arranged on the substrate, and a third conductive layer arranged at a side of the second conductive layer away from the substrate, wherein the first conductive connection member and an anode of the light-emitting element are arranged on the third conductive layer, the first conductive connection member is separated from the anode of the light-emitting element, and the first conductive connection member is lapped onto the second voltage line.

14. The display substrate according to claim 13, further comprising a second insulation layer arranged between the third conductive layer and the second conductive layer, wherein the second insulation layer is provided with a second groove and a plurality of second openings, the first conductive connection member is lapped onto the second voltage line through the second groove and the second opening, and an orthogonal projection of the second groove onto the substrate at least partially overlaps an orthogonal projection of the first groove onto the substrate.

15. The display substrate according to claim 14, wherein the first conductive connection member is provided with a plurality of third openings.

16. The display substrate according to claim 15, further comprising a pixel definition layer arranged at a side of the third conductive layer away from the substrate, wherein the pixel definition layer comprises a plurality of protection patterns, an orthogonal projection of each protection pattern onto the substrate fully covers an orthogonal projection of a corresponding third opening onto the substrate to protect the third opening, and there is a gap between the adjacent protection patterns.

17. The display substrate according to claim 16, further comprising a second conductive connection member, and a fourth conductive layer arranged at a side of the third conductive layer away from the substrate, wherein the second conductive connection member and a cathode of the light-emitting element are arranged on the fourth conductive layer, the second conductive connection member is electrically coupled to the cathode of the light-emitting layer, and the second conductive connection member is lapped onto the first conductive connection member through the gap.

18. The display substrate according to claim 1, wherein the non-display region comprises a first side region, a second side region, a third side region, a fourth side region and four rounded-corner regions, the first side region is arranged opposite to the second side region, the third side region is arranged opposite to the fourth side region, and the display substrate further comprises a third voltage line arranged at each of the third side region and the fourth side region.

19. A display device, comprising the display substrate according to claim 1.

* * * * *